United States Patent
Yamashita

(10) Patent No.: US 11,127,774 B2
(45) Date of Patent: Sep. 21, 2021

(54) IMAGE SENSOR AND ASSOCIATED FABRICATING METHOD

(71) Applicant: TAIWAN SEMICONDUCTOR MANUFACTURING COMPANY LTD., Hsinchu (TW)

(72) Inventor: Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 7 days.

(21) Appl. No.: 16/529,650

(22) Filed: Aug. 1, 2019

(65) Prior Publication Data

US 2019/0355775 A1    Nov. 21, 2019

Related U.S. Application Data

(62) Division of application No. 15/903,548, filed on Feb. 23, 2018, now Pat. No. 10,373,999.

(Continued)

(51) Int. Cl.
*H01L 27/146* (2006.01)

(52) U.S. Cl.
CPC .... *H01L 27/14636* (2013.01); *H01L 27/1463* (2013.01); *H01L 27/14629* (2013.01);
(Continued)

(58) Field of Classification Search
CPC ................................................ H01L 27/14636
See application file for complete search history.

(56) References Cited

U.S. PATENT DOCUMENTS

| | | | | |
|---|---|---|---|---|
| 6,160,834 A | * | 12/2000 | Scott ........................ | H01S 5/183 372/20 |
| 2009/0315131 A1 | | 12/2009 | Hung et al. | |

(Continued)

FOREIGN PATENT DOCUMENTS

| | | |
|---|---|---|
| CN | 106653780 A | 5/2017 |
| CN | 107039471 A | 8/2017 |
| JP | 2011060821 A | 3/2011 |

OTHER PUBLICATIONS

Notice of Allowance dated Jan. 18, 2020 issued by Korean Intellectual Property Office for counterpart application No. 10-2018-0115797.

(Continued)

*Primary Examiner* — Sarah K Salerno
(74) *Attorney, Agent, or Firm* — WPAT, P.C.; Anthony King

(57) ABSTRACT

An image sensor is disclosed. The image sensor includes: a common node heavily doped with dopants of a first conductivity type, the common node being within the substrate and abutting the front surface of the substrate; and a sensing node heavily doped with dopants of a second conductivity type opposite to the first conductivity type, the sensing node being within the substrate and abutting the front surface of the substrate; an interconnect structure, wherein the front surface of the substrate faces the interconnect structure; a distributed Bragg reflector (DBR) between the front surface of the substrate and the interconnect structure; a first contact plug passing through the DBR and coupling the common node to the interconnect structure; and a second contact plug passing through the DBR and coupling the sensing node to the interconnect structure.

20 Claims, 20 Drawing Sheets

Related U.S. Application Data

(60) Provisional application No. 62/566,194, filed on Sep. 29, 2017.

(52) U.S. Cl.
CPC .. *H01L 27/14634* (2013.01); *H01L 27/14643* (2013.01); *H01L 27/14647* (2013.01); *H01L 27/1464* (2013.01)

(56) References Cited

U.S. PATENT DOCUMENTS

| | | |
|---|---|---|
| 2012/0051383 A1* | 3/2012 | Stern .................. H01S 5/423 372/50.21 |
| 2012/0205730 A1 | 8/2012 | Chen et al. |
| 2013/0193546 A1 | 8/2013 | Webster et al. |
| 2014/0339398 A1 | 11/2014 | Mazzillo et al. |
| 2017/0132524 A1 | 5/2017 | Abdo |
| 2019/0067354 A1* | 2/2019 | Cheng .............. H01L 27/14629 |

OTHER PUBLICATIONS

English Abstract Translation of Notice of Allowance issued by Korean Intellectual Property Office.

Office action dated Apr. 13, 2020 issued by CNIPA of China for counterpart application No. 201810763440.0.

* cited by examiner

IMAGE SENSOR AND ASSOCIATED FABRICATING METHOD

CROSS REFERENCE TO RELATED APPLICATIONS

This application is a division of application Ser. No. 15/903,548, filed on Feb. 23, 2018, which claims the benefit of U.S. provisional application 62/566,194, filed on Sep. 29, 2017. All of the above-referenced applications are hereby incorporated herein by reference in their entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are solid devices that are compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
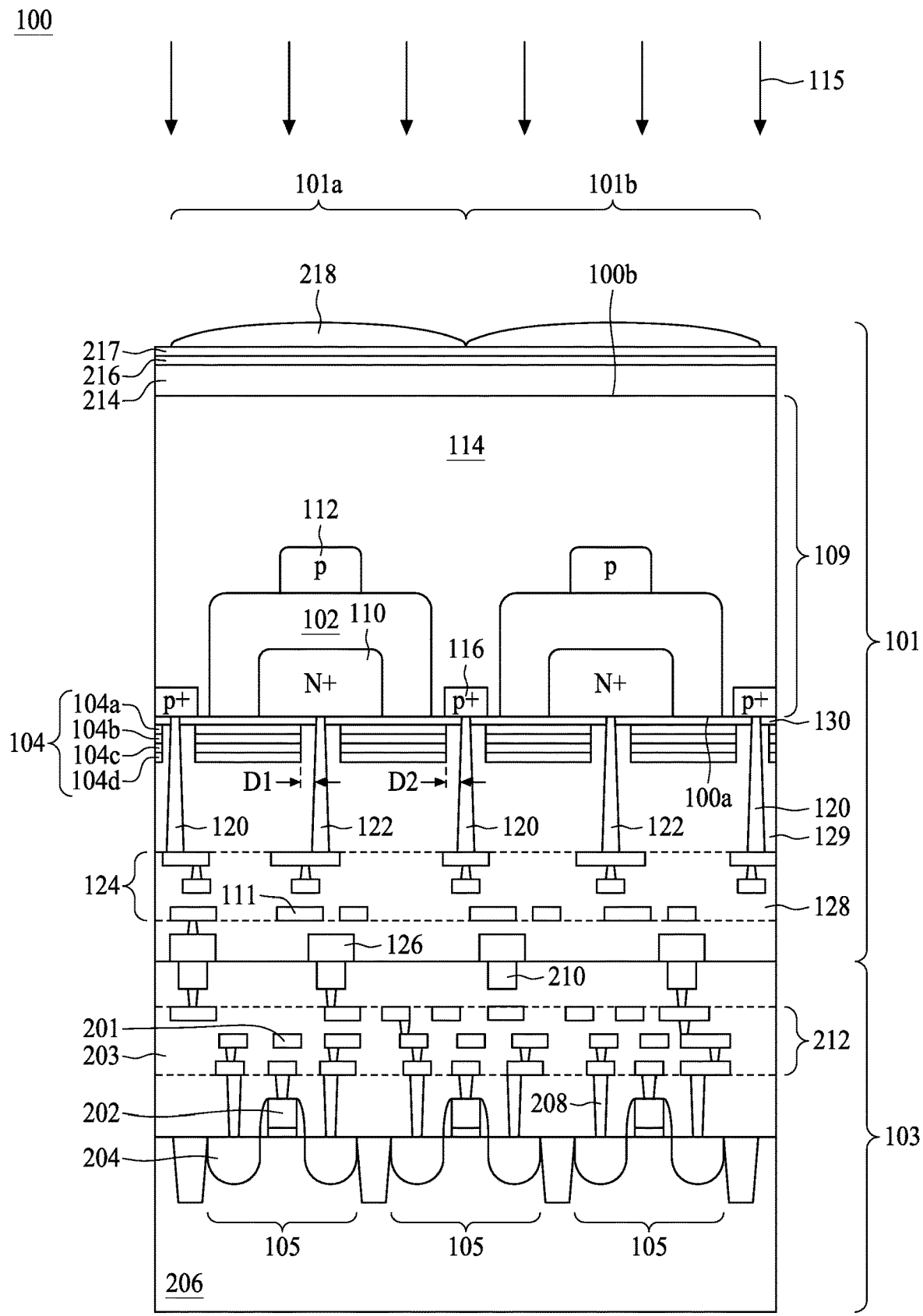
FIG. 1 is a diagram illustrating a cross-sectional view of a SPAD image sensor including a CMOS (complementary metal-oxide-semiconductor) chip and an imaging chip bonded together in accordance with a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A SPAD (single photon avalanche diode) image sensor can detect incident radiation with very low intensities (e.g., a single photon). The SPAD image sensor includes a plurality of SPAD cells arranged in an array. The SPAD cells respectively include a p-n junction, a quench circuit and a read circuit. The p-n junction operates at a reverse bias well above its breakdown voltage. During operation, photo-generated carriers move to a depletion region (i.e., a multiplication region) of the p-n junction and trigger an avalanche effect such that a signal current can be detected. The quench circuit is used to cut off the avalanche effect and reset the SPAD cell. The read circuit receives and transmits the signal current.

An existing SPAD image sensor is configured to include a reflector. Without the reflector, light may propagate towards the substrate and be absorbed by the substrate if the SPAD image sensor is formed on a light-absorbing substrate, such as silicon. In that case, a considerable part of the light will be lost instead of being sufficiently used. Similarly, when light is generated by a light-emitting diode (LED), the light will generally propagate outwards in all directions. In most cases, however, it is desired to direct the light in a very specific direction, which, without any type of reflector, would only receive a small portion of the total light emitted by the LED. Again, if the LED is formed on a light-absorbing substrate such as silicon, the light that propagates towards the substrate may be absorbed by the substrate and be mostly lost rather than merely going in an undesired direction.

An existing metal reflector may be disposed close to the silicon substrate below the first metal, thus increasing the risk of metal contamination. The present disclosure provides a distributed Bragg reflector (DBR), which uses alternating insulating layers having different refractive indices to reflect the light. The nonconductive DBR can be disposed closer to substrate without the risk of electrical short between the nonconductive DBR and contact plugs. Therefore resonance efficiency and sensitivity of the SPAD image sensor will be increased.

FIG. 1 is a diagram illustrating a cross-sectional view of a SPAD image sensor 100 including a CMOS (complementary metal-oxide-semiconductor) chip 103 and an imaging chip 101 bonded together in accordance with a first embodiment of the present disclosure. The SPAD image sensor 100 includes an array of pixels 101a to 101b as shown in FIG. 1 for illustrative purpose. For many instances, the SPAD image sensor 100 may include more than two pixels. The CMOS chip 103 has a plurality of active devices 105. In some embodiments, the CMOS chip 103 includes an interconnect structure 212 disposed over a substrate 206. In some embodiments, the interconnect structure 212 includes a plurality of metal layers 201 disposed within an inter-layer dielectric (ILD) layer 203. The active devices 105 are disposed at least in the substrate 206. The imaging chip 101 includes an interconnect structure 124 disposed between the interconnect structure 212 of the CMOS chip 103 and a substrate 109 of the imaging chip 101. The interconnect structure 124 includes a plurality of metal layers 111 disposed within an ILD layer 128.

Each of the pixels 101a and 101b includes a SPAD cell disposed within the substrate 109. The substrate 109 includes a front surface 100a facing the interconnect structure 124 and a back surface 100b facing opposite to the interconnect structure 124. A dielectric layer 129 is between the substrate 109 and the interconnect structure 124. A DBR 104 is between the dielectric layer 129 and the substrate 109. The DBR 104 is comprised of alternating insulating layers.

For example, the DBR may include at least one pair of layers including a first layer and a second layer selected from two of silicon dioxide ($SiO_2$), undoped polysilicon (poly) and silicon nitride ($Si_3N_4$). However, this is not a limitation of the present disclosure. The DBR 104 may be configured to include other materials based on the required refractive index according to different processes and design considerations. In particular, the DBR 104 is preferably formed from silicon dioxide ($SiO_2$)/undoped polysilicon (poly) pairs. In some embodiments, the DBR 104 may be formed from silicon nitride (SiN or $Si_3N_4$)/undoped polysilicon (poly) pairs. In some embodiments, the DBR 104 may be formed from silicon dioxide ($SiO_2$)/silicon nitride (SiN or $Si_3N_4$) pairs. The number of pairs may range from as few as one to as many as ten. Although the effectiveness in reflecting light becomes better as the pairs of layers increases, but the obtained marginal effect also decays exponentially with the increasing of pairs of layers. As such, the number of pairs may be configured to about two to three pairs of layers according to some embodiments.

As illustrated in FIG. 1, two pairs of layers are shown to constitute the DBR 104, including a first $SiO_2$ layer 104a, a first undoped poly layer 104b, a second $SiO_2$ layer 104c, a second undoped poly layer 104d. The DBR 104 is discontinuously formed between the front surface 100a of the substrate 109 and the interconnect structure 124. In FIG. 1, the DBR 104 is not in physical contact with sidewalls of the contact plugs 120 and 122. In some embodiments, a distance D1 between the DBR 104 and the sidewalls of contact plugs 122 may be greater than about 0.05 µm for further increasing a margin between the DBR 104 and the contact plugs 122 in order to reduce the risk of electrical short and leakage of the sense node 110. A distance D2 between the DBR 104 and the sidewalls of contact plugs 120 may be greater than about 0.05 µm in order to reduce the risk of electrical short and leakage of the common node 116.

In some embodiments, the contact plugs 120 and 122 are self-aligned contacts (SAC) fabricated by patterning the dielectric layer 129. Between the dielectric layer 129 and the front surface 100a of the substrate 109, a contact etch-stop layer (CESL) 130 may be optionally formed. The CESL 130 includes one or more layers of a silicon-nitride based compound such as SiN, SiON, SiCN or SiOCN. As shown in FIG. 1, the CESL 130 is between the DBR 104 and the front surface 100a of the substrate 109. In particular, a first side of the CESL 130 facing the substrate 109 is in physical contact with the front surface 100a of the substrate 109; and a second side of the CESL 130 facing opposite to the front surface 100a of the substrate 109 is in physical contact with the first $SiO_2$ layer 104a of the DBR 104.

The substrate 109 may include a first layer 114 doped with dopants of a first conductivity type, e.g., p type. A dopant concentration of the first layer 114 of the first conductivity type may be at a level of about $1e16/cm^3$. The substrate 109 may further include a second layer 102 in each of the pixels 101a and 101b. The second layer 102 may be doped with dopants of a second conductivity type, e.g., n type, opposite to the conductivity type of the first layer 114. A dopant concentration of the second layer 102 may be at a level of about $1e17/cm^3$ to about $1e19/cm^3$. The second layer 102 is between the first layer 114 and the front surface 100a of the substrate 109. In particular, the second layer 102 immediately abuts the front surface 100a of the substrate 109. For many instances, the second layer 102 of the pixels 101a is separated from the second layer 102 of the pixels 101b, and the second layer 102 of the pixels 101a is not in contact with the second layer 102 of the pixels 101b. In some embodiments, the second layer 102 may be omitted, i.e. replaced by the first layer 114.

Each of the pixels 101a and 101b further includes a sensing node 110 heavily doped with dopants of the second conductivity type, e.g., n type, the same to the conductivity type of the second layer 102. A dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about $1e20/cm^3$. The sensing node 110 is formed in the substrate 109 and immediately abuts the front surface 100a of the substrate 109. In particular, the sensing node 110 is formed within the second layer 102 and is encompassed by the second layer 102. In other words, the sensing node 110 is separated from the first layer 114 by the second layer 102. Through the contact plug 122, the sensing node 110 is able to be coupled to the active devices 105 of the CMOS chip 103 via the interconnect structure 124 and the ILD layer 203. In some embodiments, the active devices 105 may include active quench circuit to stop avalanche effect and reset bias of the SPAD cells. The active devices 105 may also include read circuit and other control or logic circuits. For example, the active devices 105 may include a transistor device having a gate structure 202 and source/drain regions 204. The sensing node 110 can be coupled to a source/drain region 204 of the transistor through a contact plug 208.

Each of the pixels 101a and 101b may further includes a third layer 112 doped with dopants of the first conductivity type, e.g., p type, the same to the conductivity type of the first layer 114. A dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about $1e17/cm^3$. The third layer 112 is formed in the first layer 114 and immediately abuts the second layer 102. In particular, the third layer 112 is formed within the first layer 114 and is encompassed by the first layer 114. In particular, the third layer 112 is separated from the sensing node 110 by the second layer 102.

A common node 116 is formed between each two adjacent pixels and abutting the front surface 100a of the substrate 109. The common node 116 may be heavily doped with dopants of the first conductivity type, e.g., p type, the same to the conductivity type of the first layer 114 and the third layer 112. A dopant concentration of the common node 116 may be heavier than the dopant concentration of the first layer 114 and the third layer 112. In some embodiments, a ratio of the dopant concentration of the common node 116 to the dopant concentration of the third layer 112 may be in a range from about 10 to about 1000. In an embodiment, the dopant concentration of the common node 116 may be at a level of about $5e18/cm^3$. Through the contact plug 120, the common node 116 is able to be coupled to the active devices 105 of the CMOS chip 103 via the interconnect structure 124 and the ILD layer 203. In an embodiment, each of the common nodes 116 and the contact plugs 120 is shared by neighboring SPAD cells.

In some embodiments, the imaging chip 101 and the CMOS chip 103 are bonded together by a hybrid bond including a metal-to-metal bond and a dielectric-to-dielectric bond. The metal to metal bond (e.g. a diffusion bond) can be between a top metal layer 126 of the plurality of metal layers 111 and a top metal layer 210 of the plurality of metal layers 201. The dielectric-to-dielectric bond can be between the ILD layer 128 and the ILD layer 203 such that the ILD layer 128 and the ILD layer 203 are in direct contact with one another. The top metal layers 126 and 210 function as a pair of bonding pads and can include re-distribution layers (RDLs). In some embodiments, the dielectric-to-dielectric bond is an oxide-to-oxide bond.

In some embodiments, the imaging chip 101 may as well have a plurality of active devices in peripheral regions of the substrate 109 at around the array of pixels 101a to 101b. For instance, a portion or all of the active quench circuit, the read circuit and other control or logic circuits mentioned above may be disposed in the substrate 109 of the imaging chip 101 instead of the CMOS chip 103.

In some embodiments, the SPAD image sensor 100 further includes a high-k dielectric layer 214 and/or an anti-reflective coating (ARC) layer 216 disposed over the back surface 100b of the substrate 109, configured to facilitate transmissions of the incident photons 115 from the back surface 100b to the SPAD cells 107. The SPAD image sensor 100 may further include a color filter layer 217 over the ARC layer 216. For many instances, the color filter layer 217 contains a plurality of color filters positioned such that the incoming radiation is directed thereon and therethrough. The color filters includes a dye-based (or pigment based) polymer or resin for filtering a specific wavelength band of the incoming radiation, which corresponds to a color spectrum (e.g., red, green, and blue). A micro-lens layer 218 containing a plurality of micro-lenses is formed over the color filter layer 217. The micro-lenses 218 direct and focus the incoming radiation 115 toward the SPAD cells. The micro-lenses 218 may be positioned in various arrangements and have various shapes depending on a refractive index of a material used for the micro-lens 218 and distance from a sensor surface. For many instances, a center of each of the micro-lenses 218 overlaps a center of each of the corresponding SPAD cells from a top view. In some embodiments, the SPAD image sensor 100 may further include a light trapping structure to increase the efficiency of resonance.

Figure 2:
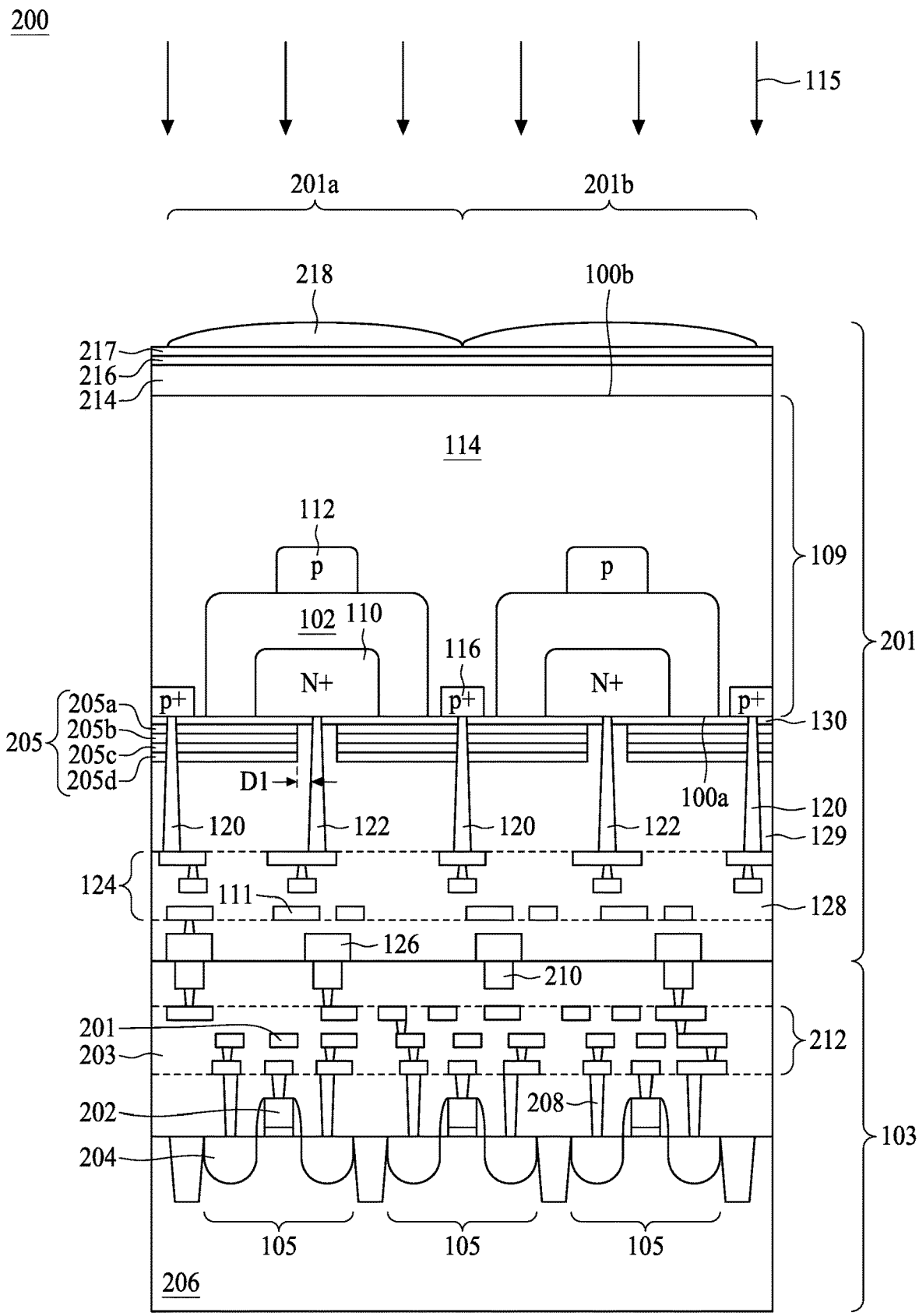
FIG. 2 is a diagram illustrating a cross-sectional view of a SPAD image sensor including the CMOS chip and an imaging chip bonded together in accordance with a second embodiment of the present disclosure.

FIG. 2 is a diagram illustrating a cross-sectional view of a SPAD image sensor 200 including the CMOS chip 103 and an imaging chip 201 bonded together in accordance with a second embodiment of the present disclosure. The imaging chip 201 is the same to the imaging chip 101 except a DBR 205 may be in physical contact with sidewalls of the contact plugs 120 since the leakage of the common node 116 is not as critical as the sense node 110. As such, the DBR 205 and the sidewalls of contact plugs 122 are still kept a distance D1 greater than about 0.05 μm in order to reduce the risk of electrical short and leakage of the sense node 110. In many instances, the DBR 205 may be comprised of materials substantially the same or similar to the DBR 104 of FIG. 1.

Figure 3:
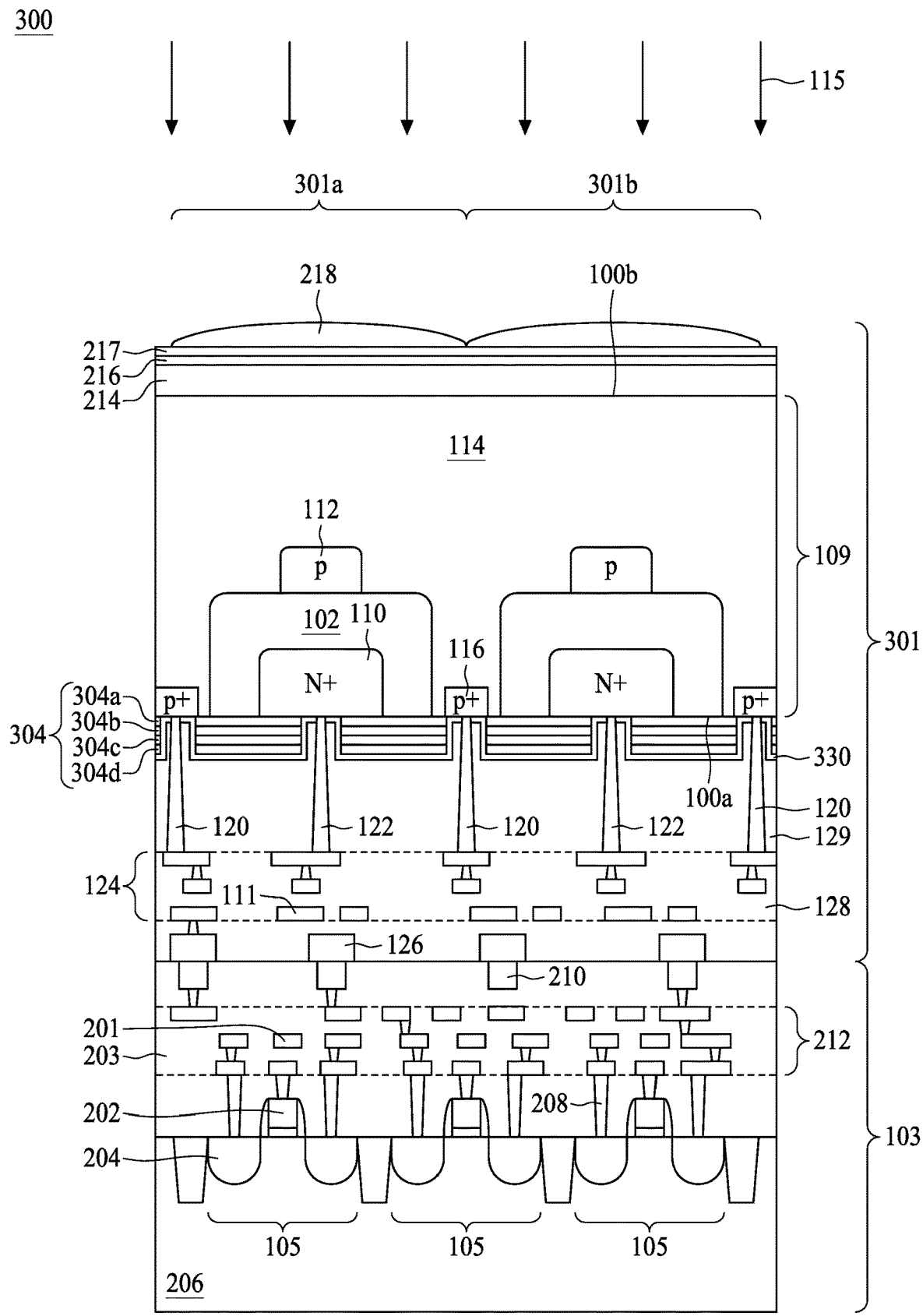
FIG. 3 is a diagram illustrating a cross-sectional view of a SPAD image sensor including the CMOS chip and an imaging chip bonded together in accordance with a third embodiment of the present disclosure.

FIG. 3 is a diagram illustrating a cross-sectional view of a SPAD image sensor 300 including the CMOS chip 103 and an imaging chip 301 bonded together in accordance with a third embodiment of the present disclosure. The imaging chip 301 is the same to the imaging chip 101 except a DBR 304 is between a CESL 330 and the front surface 100a of the substrate 109. In particular, a first surface of the DBR 304 is in physical contact with the front surface 100a of the substrate 109. The CESL 330 covers a second surface of the DBR 304 opposite to the first surface of the DBR 304 and sidewalls of the DBR 304. The CESL 330 further extends to the front surface 100a of the substrate 109 at regions intentionally reserved in order to distance the DBR 204 from the contact plugs 120 and 122. In some embodiments, the DBR 304 of the SPAD image sensor 300 may be replaced by the DBR 205. In other words, it may be changed to allow the DBR 304 to be in physical contact with the contact plugs 120. In many instances, the DBR 304 may be comprised of materials substantially the same or similar to the DBR 104 of FIG. 1.

Figure 4:
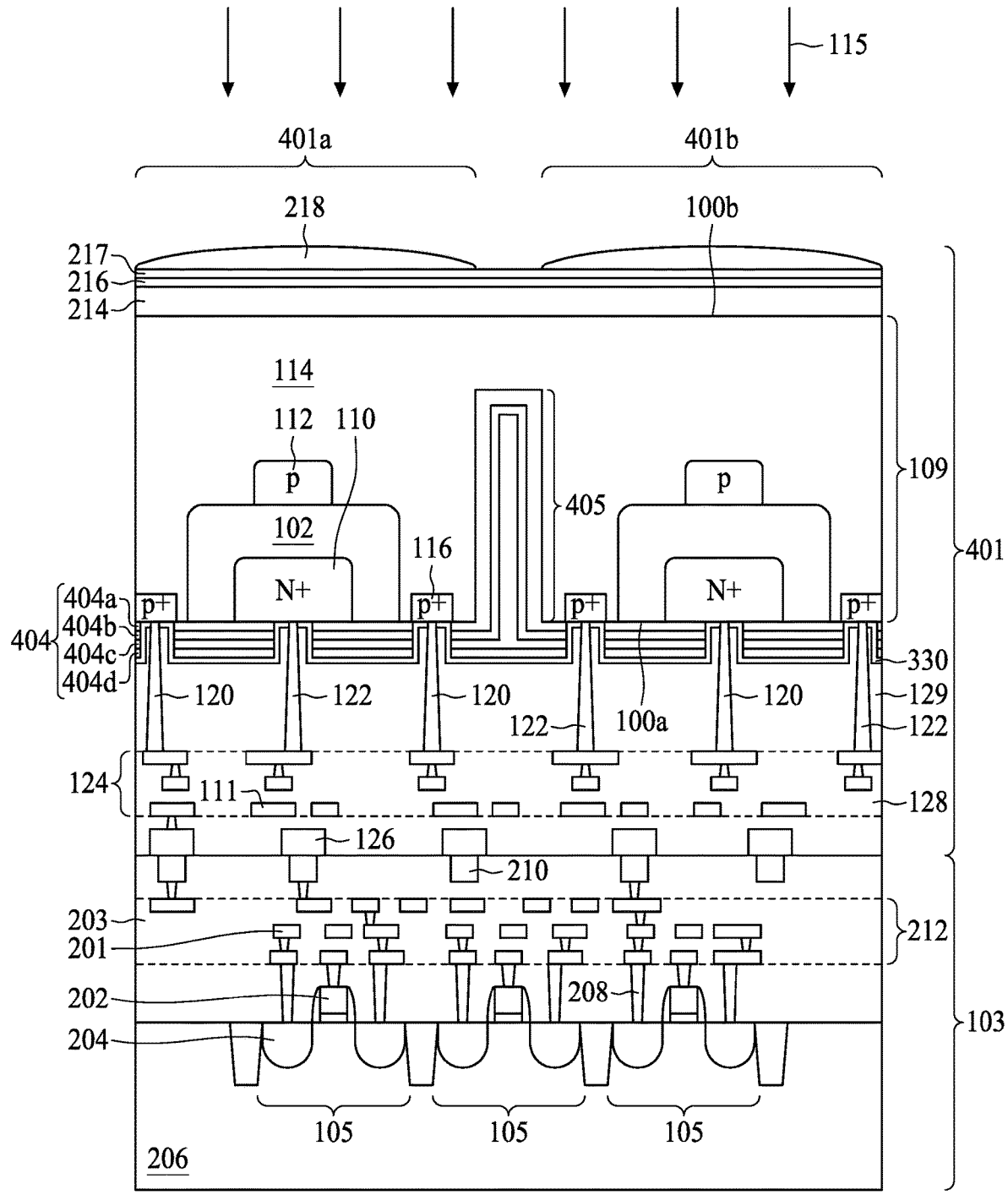
FIG. 4 is a diagram illustrating a cross-sectional view of a SPAD image sensor including the CMOS chip and an imaging chip bonded together in accordance with a fourth embodiment of the present disclosure.

FIG. 4 is a diagram illustrating a cross-sectional view of a SPAD image sensor 400 including the CMOS chip 103 and an imaging chip 401 bonded together in accordance with a fourth embodiment of the present disclosure. Compared to the imaging chip 301, a distance between the pixel 101a and the pixel 101b of the imaging chip 401 is further increased to allow a portion 405 of a DBR 404 to be inserted into the substrate 109 from the front surface 100a. The portion 405 of the DBR 404 may extend into the substrate 109 further than the third layer 112. In some embodiments, the portion 405 of the DBR 404 may pass through the substrate 109.

The portion 405 of the DBR 404 may work as a trench isolation to further reduce optical loss and crosstalk between adjacent pixels. In particular, the portion 405 includes a first $SiO_2$ layer 404a, a first undoped poly layer 404b, and a second $SiO_2$ layer 404c. The second undoped poly layer 104d does not extend into the substrate 109. However, the first undoped poly layer 404b forms a U-shape structure in the portion 405. Therefore, the effectiveness in reflecting light of the portion 405 of the DBR 404 is not worse than the other portion of the DBR 404. In many instances, the DBR 404 may be comprised of materials substantially the same or similar to the DBR 104 of FIG. 1.

Figure 5:
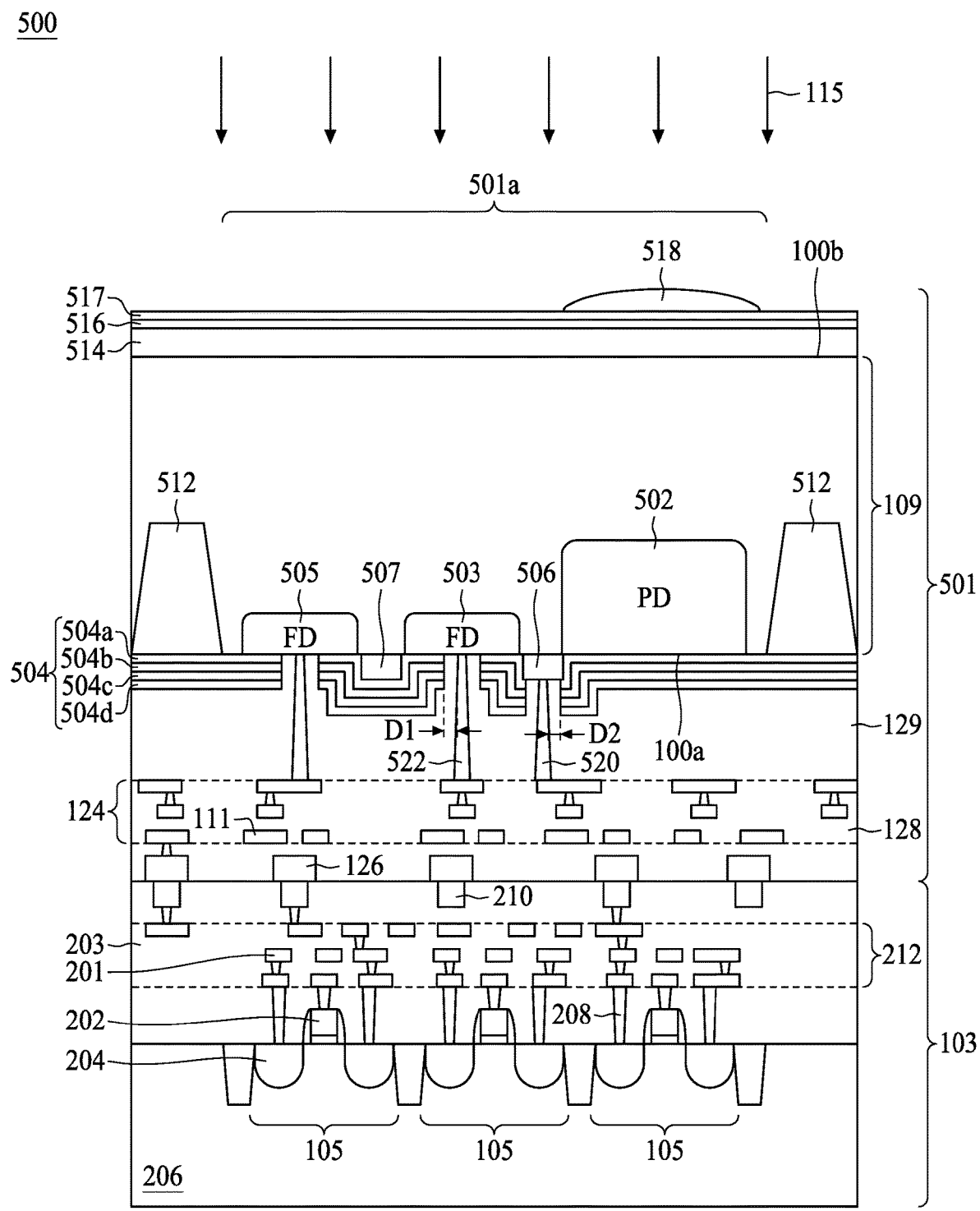
FIG. 5 is a diagram illustrating a cross-sectional view of an image sensor including the CMOS chip and an imaging chip bonded together in accordance with a fifth embodiment of the present disclosure.

FIG. 5 is a diagram illustrating a cross-sectional view of an image sensor 500 including the CMOS chip 103 and an imaging chip 501 bonded together in accordance with a fifth embodiment of the present disclosure. In an embodiment, the image sensor 500 is a complementary metal-oxide-semiconductor (CMOS) image sensor (CIS). The image sensor 500 includes an array of pixels, although only a pixel 101a is shown in FIG. 1 for illustrative purpose. FIG. 5 shows a gate 506 of a transfer transistor and a gate 507 of reset transistor at a front surface 100a of the substrate 109. The substrate 109 may include a photodiode (PD) 502 and floating diffusion regions (FD) 503 and 505. The PD 502 may be next to the gate 506 of the transfer transistor. The transfer transistor and the reset transistor share the FD 503. The pixel 501a is separated from other pixels by trench isolations 512. Through the contact plugs 520 and 522, the gate 506 and FD 503 are able to be coupled to the active devices 105 of the CMOS chip 103 via the interconnect structure 124 and the ILD layer 203.

A DBR 504 is between the dielectric layer 129 and the substrate 109. In many instances, the DBR 504 may be comprised of materials substantially the same or similar to the DBR 104 of FIG. 1. The DBR 504 covers the front surface 100a of the substrate 109 and encompasses surrounds the gate 506 and the gate 507. In FIG. 5, the DBR 504 is not in physical contact with sidewalls of the contact plugs 520 and 522. In some embodiments, a distance D1 between the DBR 504 and the sidewalls of contact plugs 522 may be greater than about 0.05 μm for further increasing a margin between the DBR 504 and the contact plugs 522 in order to reduce the risk of electrical short and leakage of the FD 503. A distance D2 between the DBR 504 and the sidewalls of contact plugs 520 may be greater than about 0.05 μm in order to reduce the risk of electrical short and leakage of the PD 502.

In some embodiments, a CESL (not shown) may be optionally formed between the DBR 504 and the front surface 100a of the substrate in a manner similar to FIG. 1 and FIG. 2. In some embodiments, the DBR 504 may be formed between the CESL and the front surface 100a of the substrate in a manner similar to FIG. 3 and FIG. 4. The CESL may be comprised of materials substantially the same or similar to the CESL 130 and the CESL 330.

Figure 6:
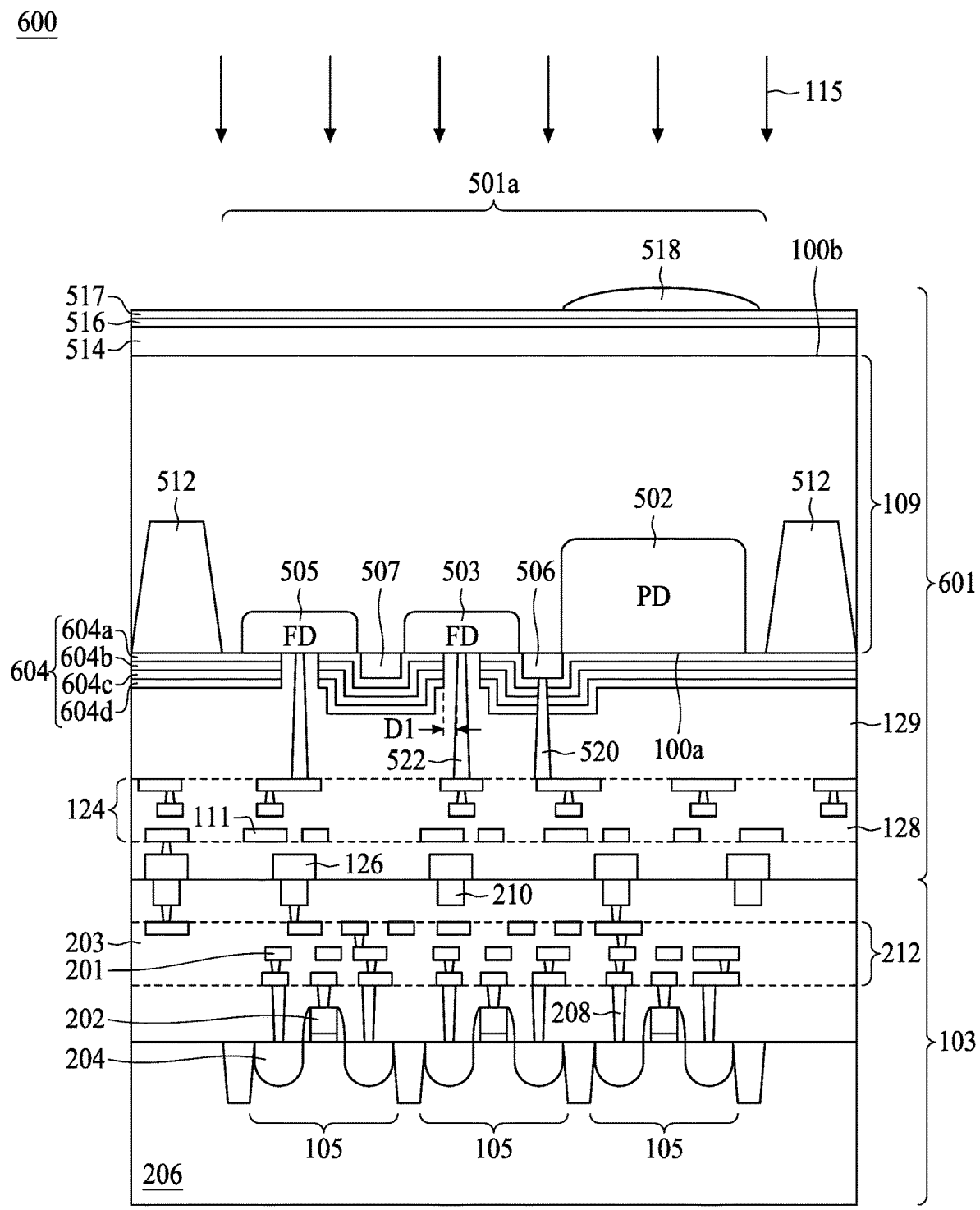
FIG. 6 is a diagram illustrating a cross-sectional view of an image sensor including the CMOS chip and an imaging chip bonded together in accordance with a sixth embodiment of the present disclosure.

FIG. 6 is a diagram illustrating a cross-sectional view of an image sensor 600 including the CMOS chip 103 and an imaging chip 601 bonded together in accordance with a sixth embodiment of the present disclosure. The imaging chip 601 is the same to the imaging chip 501 except a DBR 604 may be in physical contact with sidewalls of the contact plugs 520 since the leakage of the gate 506 is not as critical as the FD 503. As such, the DBR 604 and the sidewalls of contact plugs 522 are still kept a distance D1 greater than about 0.05 μm in order to reduce the risk of electrical short and leakage of the FD 503. In many instances, the DBR 604 may be comprised of materials substantially the same or similar to the DBR 104 of FIG. 1.

Figure 7:
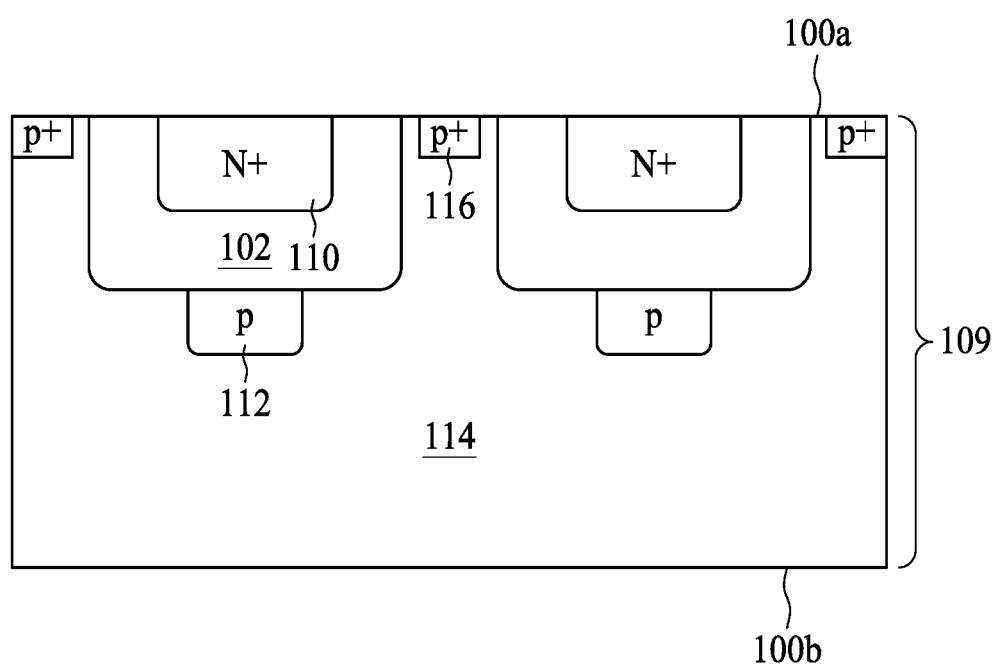
FIG. 7 to FIG. 12 are diagrams illustrating fragmentary cross-sectional views of the SPAD image sensor at various stages of fabrication in accordance with some embodiment of the disclosure.

FIG. 7 to FIG. 12 are diagrams illustrating fragmentary cross-sectional views of the SPAD image sensor 300 at various stages of fabrication in accordance with some embodiment of the disclosure. It is understood that FIG. 7 to FIG. 12 have been simplified for a better understanding of the inventive concepts of the present disclosure and may not be drawn to scale. With reference to FIG. 7, the substrate 109 is provided. The substrate 109 includes the first layer 114. The first layer 114 may be doped with dopants of the first conductivity type, and has the dopant concentration at a level of about $1e16/cm^3$. The first layer 114 extends from the front surface 100a to the back surface 100b of the substrate 109. An ion implantation may be performed upon the front surface 100a of the substrate 109 with dopants of the second conductivity type, for instance, the n type dopant, opposite to the conductivity type of the first layer 114 to form the second layer 102. The dopant concentration of the second layer 102 may be at a level of about $1e17/cm^3$ to about $1e19/cm^3$. In particular, the second layer 102 extends from the front surface 100a of the substrate 109 toward the back surface 100b of the substrate 109.

Subsequent to the second layer 102, the third layer 112, the sensing node 110 and the common node 116 may be formed by ion implantation as well. The third layer 112 may be doped with dopants of the first conductivity type, e.g., p type, the same to the conductivity type of the first layer 114. The dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about $1e17/cm^3$. The third layer 112 is formed in the first layer 114 and immediately abuts the second layer 102. In particular, the third layer 112 is formed within the first layer 114 and is encompassed by the first layer 114. The sensing node 110 may be heavily doped with dopants of the second conductivity type, e.g., n type, the same to the conductivity type of the second layer 102. The dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about $1e20/cm^3$.

The sensing node 110 is formed in the substrate 109 and immediately abuts the front surface 100a of the substrate 109. In particular, the sensing node 110 is formed within the second layer 102 and is encompassed by the second layer 102.

The common node 116 is formed between each two adjacent pixels and abutting the front surface 100a of the substrate 109. The common node 116 may be heavily doped with dopants of the first conductivity type, e.g., p type, the same to the conductivity type of the first layer 114 and the third layer 112. A dopant concentration of the common node 116 may be heavier than the dopant concentration of the first layer 114 and the third layer 112. In some embodiments, a ratio of the dopant concentration of the common node 116 to the dopant concentration of the third layer 112 may be in a range from about 10 to about 1000. In an embodiment, the dopant concentration of the common node 116 may be at a level of about $5e18/cm^3$.

Figure 8:
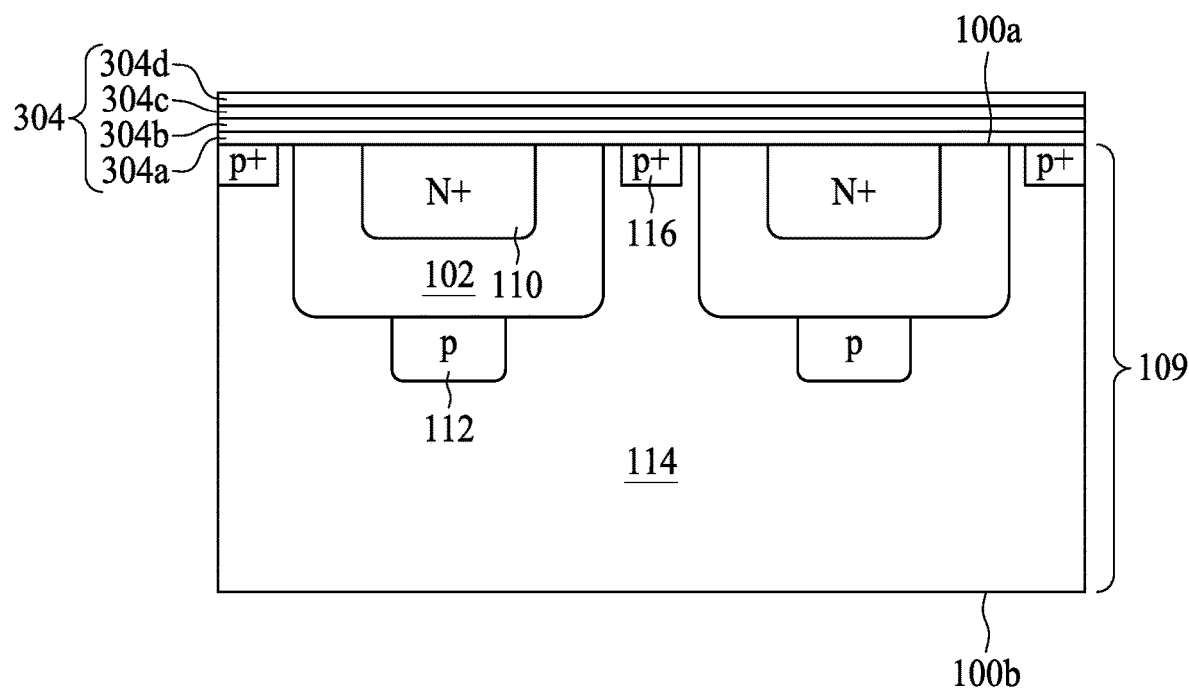
Figure 9:
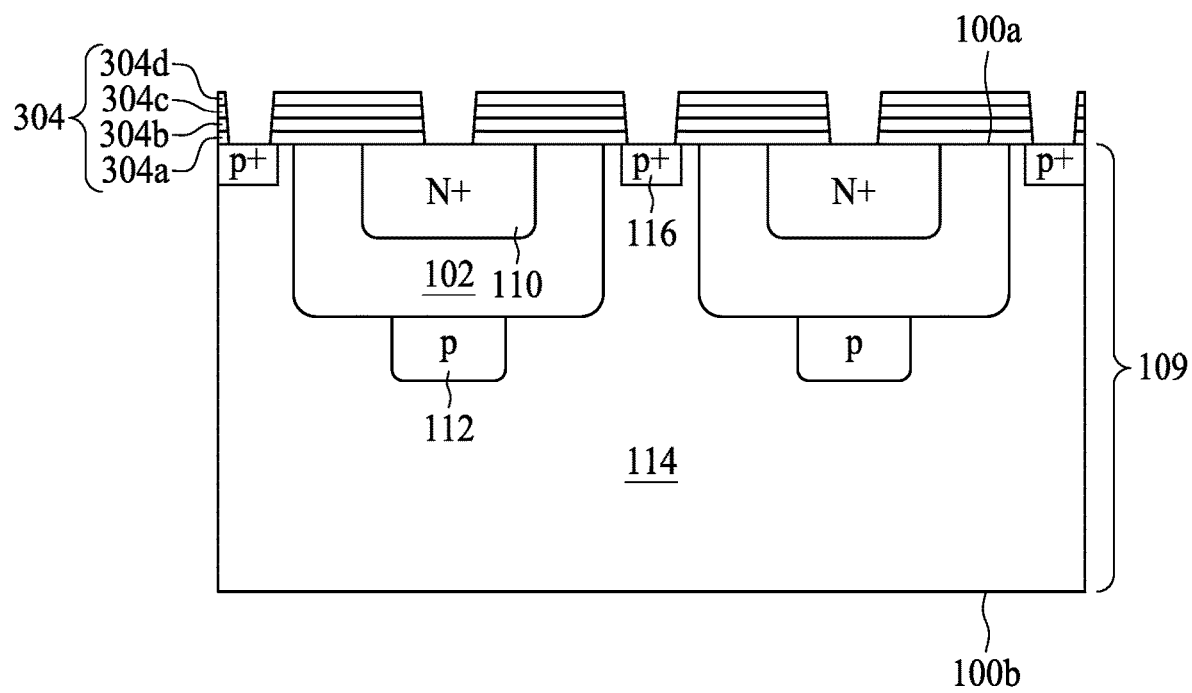

With reference to FIG. 8, the DBR 304 is deposited over the front surface 100a of the substrate 109. In particular, the first $SiO_2$ layer 304a, the first undoped poly layer 304b, the second $SiO_2$ layer 304c, the second undoped poly layer 304d are deposited by a physical vapor deposition technique (e.g., PVD, CVD, etc.) in an alternating manner to form two insulating pairs for illustrative purpose. The DBR 304 is then etched to from openings in order to expose at least a portion of the common nodes 116 and the sensing nodes 110. The openings through the DBR 304 may have trapezoidal profiles as shown in FIG. 9. However, this is not a limitation of the present disclosure. In many instances, the openings through the DBR 304 may have elongated rectangular profiles.

Figure 10:
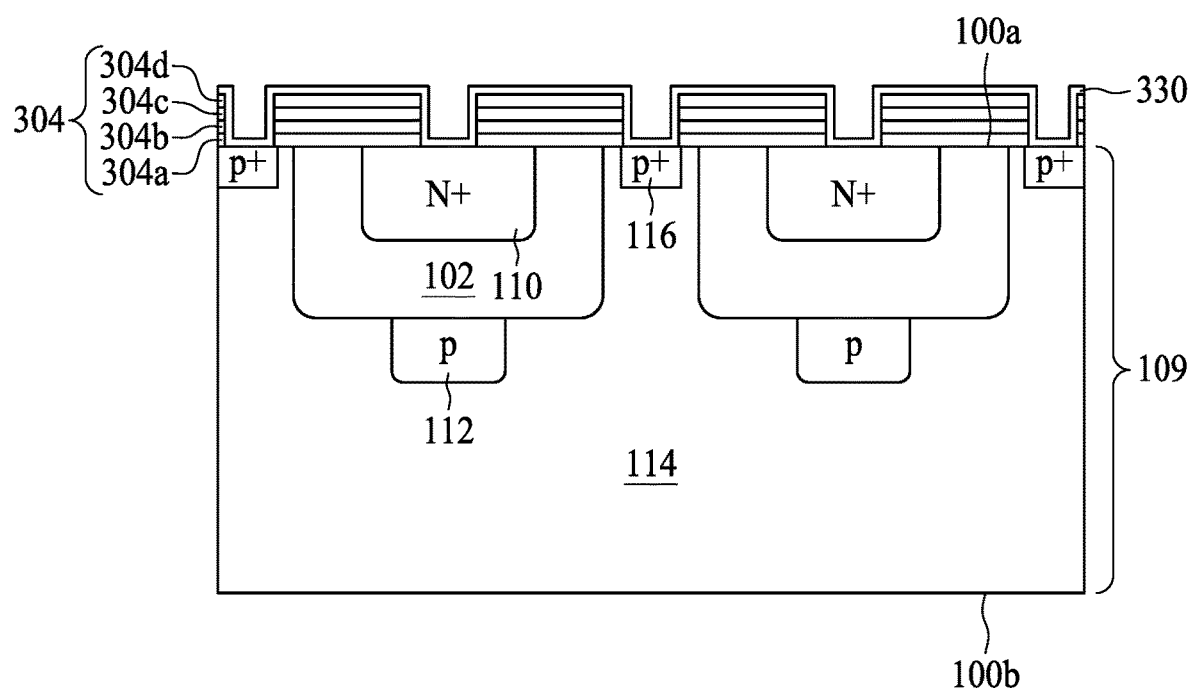
Figure 11:
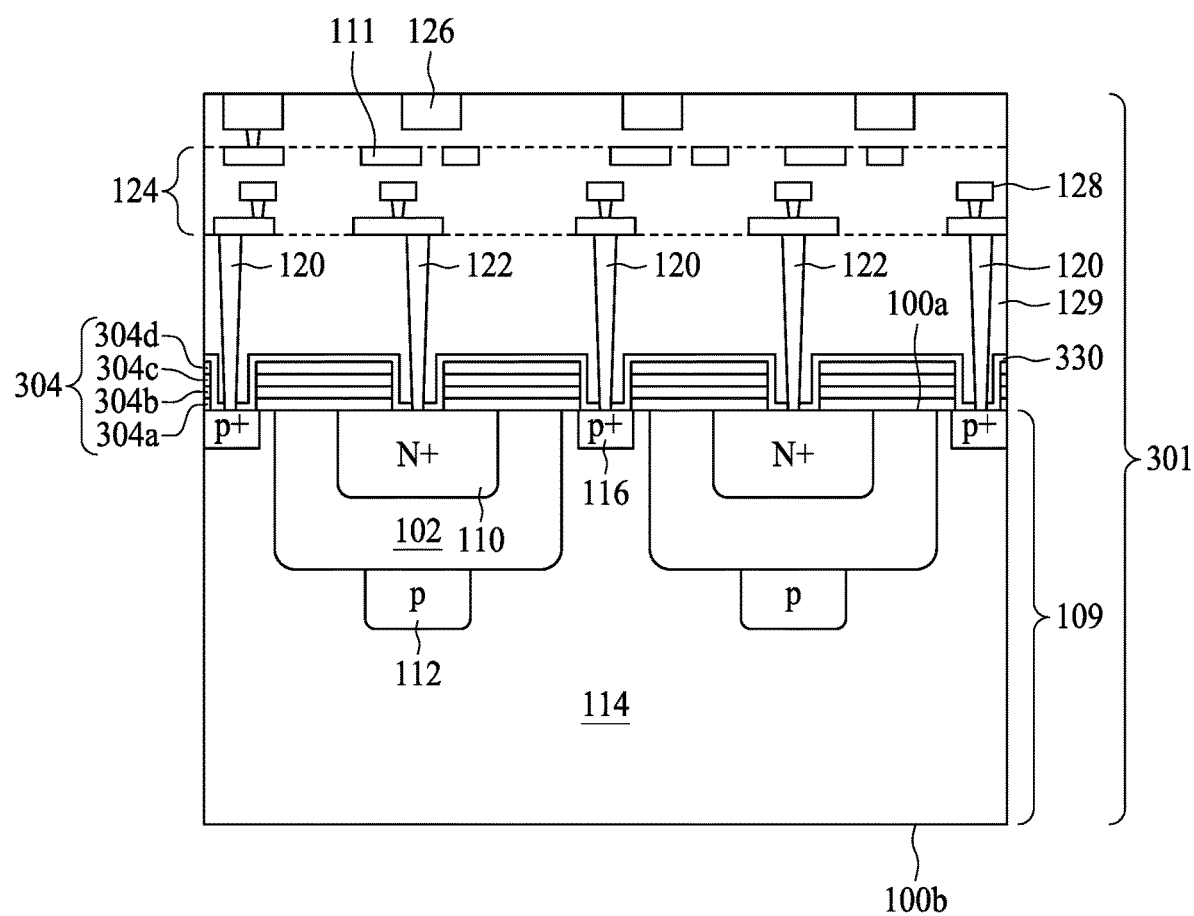

With reference to FIG. 10, the CESL 330 is blanket formed over the resultant structure of DBR 304 and the substrate 109. The CESL 330 may be conformally formed along the surface and sidewall of the DBR 304 and cover the exposed common nodes 116 and sensing nodes 110. The CESL 330 may include one or more layers of a silicon-nitride based compound such as SiN, SiON, SiCN or SiOCN. The CESL 330 may be made of CVD or ALD. Next, the dielectric layer 129 may be formed over the front surface 100a of the substrate 109 and fills the openings of the DBR 304 as shown in FIG. 11. The dielectric layer 129 is subsequently etched to form via holes and/or metal trenches. The via holes and/or metal trenches are then filled with a conductive material to form the contact plugs 122 and 120 for coupling the sensing nodes 110 and the common nodes 116 respectively. In some embodiments, the contact plugs 122 and 120 may be comprised of tungsten, copper, or aluminium copper, for example. The interconnect structure 124 is formed over the substrate 109, forming the imaging chip 301. In some embodiments, the interconnect structure 124 may be formed by forming the ILD layer 128, which includes one or more layers of ILD material, over the dielectric layer 129. The ILD layer 128 is subsequently etched to form via holes and/or metal trenches. The via holes and/or metal trenches are then filled with a conductive material to form the plurality of metal layers 111. In some embodiments, the ILD layer 128 may be deposited by a physical vapor deposition technique (e.g., PVD, CVD, etc.). The plurality of metal layers 111 may be formed using a deposition process and/or a plating process (e.g., electroplating, electro-less plating, etc.). In various embodiments, the plurality of metal layers 111 may be comprised of tungsten, copper, or aluminum copper, for example. In some embodiments, a top metal layer 126 of the plurality of metal layers 111 has an upper surface aligned with an upper surface of the ILD layer 128.

Figure 12:
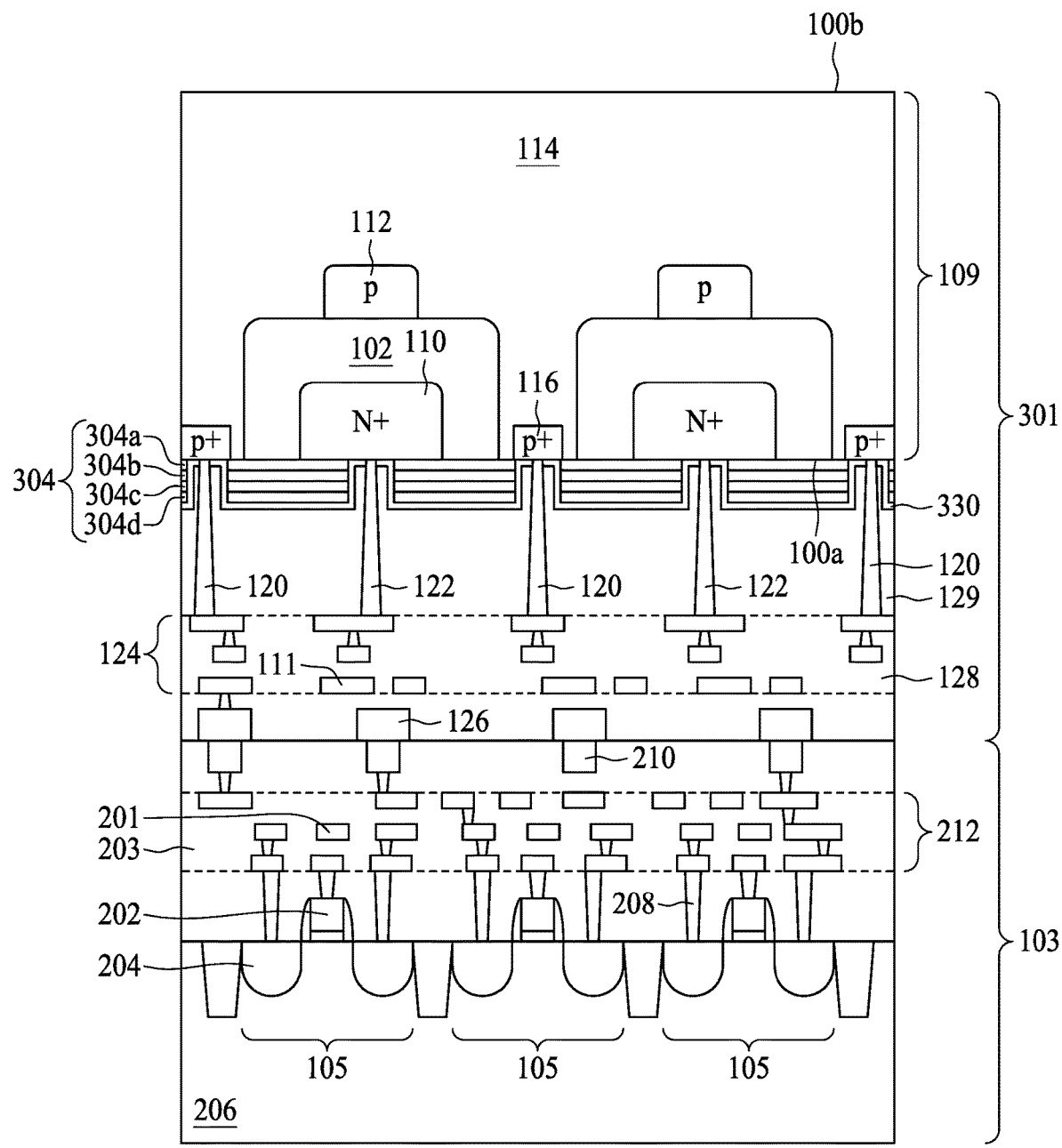

With reference to FIG. 12, the imaging chip 301 is bonded to the CMOS chip 103. The CMOS chip 103 includes the substrate 206. The active devices 105 are formed within the substrate 206. In various embodiments, the substrate 206 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the active devices 105 may include transistors formed by depositing the gate structure 202 over the substrate 206 and forming the source/drain regions 204 by implantation or epitaxial growth. The interconnect structure 212 is formed over the substrate 206, to form the CMOS chip 103. In some embodiments, the interconnect structure 212 may be formed by forming the ILD layer 203, which includes one or more layers of ILD material, over the substrate 206. The ILD layer 203 is subsequently etched to form via holes and/or metal trenches. The via holes and/or metal trenches are then filled with a conductive material to form the plurality of metal layers 201. In some embodiments, the ILD layer 203 may be deposited by a physical vapor deposition technique (e.g., PVD, CVD, etc.). The metal layers 201 may be formed using a deposition process and/or a plating process (e.g., electroplating, electro-less plating, etc.). In various embodiments, the plurality of metal layers 201 may be comprised of tungsten, copper, or aluminum copper, for example. In some embodiments, the top metal layer 210 of the plurality of metal layers 201 has an upper surface aligned with an upper surface of the ILD layer 203.

In some embodiments, the bonding process may form a hybrid bond including a metal-to-metal bond and a dielectric-to-dielectric bond. The top metal layer 210 and the top metal layer 126 can be bonded together in direct. The ILD layer 128 and the ILD layer 203 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the ILD layer 128 and the ILD layer 203.

Referring back to FIG. 3, an etching may be performed, incorporating etchant such as acidic solution, to remove a portion of the substrate 109 from the back surface 100b. In other embodiments, the substrate 109 may be thinned by mechanical grinding the back surface 100b of the substrate 109. In some embodiments, a light trapping structure may be formed. Then the high-k dielectric layer 214 is formed over the back surface 100b of the substrate 109. An ARC layer 216 can be formed over the high-k dielectric layer 214. In some embodiments, the high-k dielectric layer 214 and the ARC layer 216 may be deposited using a physical vapor deposition technique.

The color filters 217 can be formed over the back surface 100b of the substrate 109. In some embodiments, the color filters 217 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. The micro-lenses 218 can also be formed over the color filters 217. In some embodiments, the micro-lenses 218 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The micro-lenses 218 are then formed by selectively etching the micro-lens material according to the micro-lens template.

Figure 13:
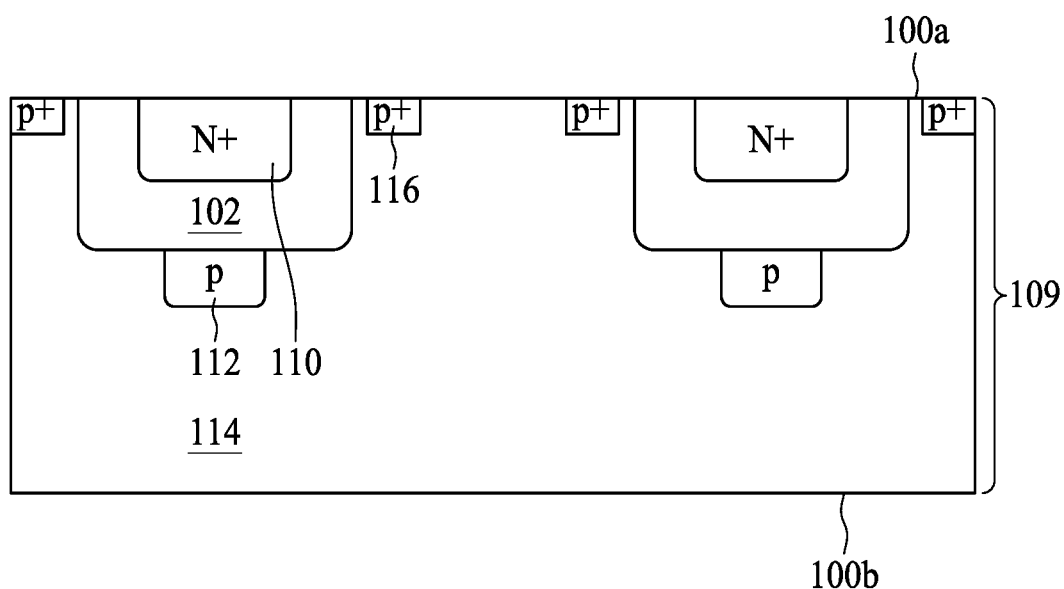
FIG. 13 to FIG. 20 are diagrams illustrating fragmentary cross-sectional views of the SPAD image sensor at various stages of fabrication in accordance with some embodiment of the disclosure.

FIG. 13 to FIG. 20 are diagrams illustrating fragmentary cross-sectional views of the SPAD image sensor 400 at various stages of fabrication in accordance with some embodiment of the disclosure. It is understood that FIG. 13 to FIG. 20 have been simplified for a better understanding of the inventive concepts of the present disclosure and may not be drawn to scale. With reference to FIG. 13, the substrate 109 is provided and then an ion implantation may be performed upon the front surface 100a of the substrate 109 to form the second layer 102, the third layer 112, the sensing nodes 110 and the common nodes 116 in a manner substantially the same or similar to FIG. 7. The difference between FIG. 13 and FIG. 7 is that the two sensing nodes 110 of FIG. 13 are separated further. In addition, the number of common nodes 116 of FIG. 13 is more than FIG. 7 because the common nodes 116 of FIG. 13 are not shared by adjacent pixels anymore.

Figure 14:
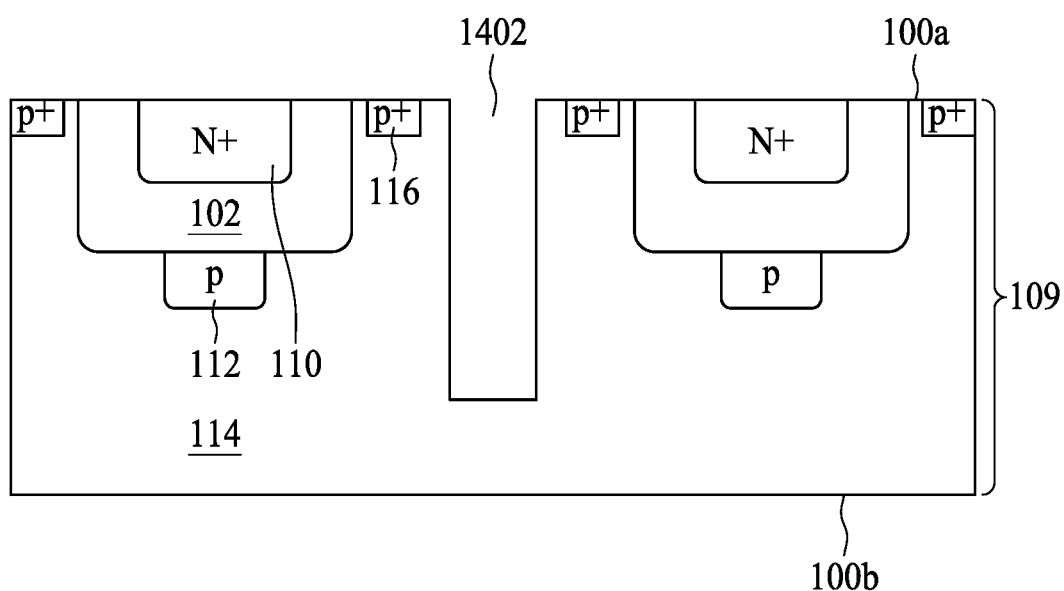
Figure 15:
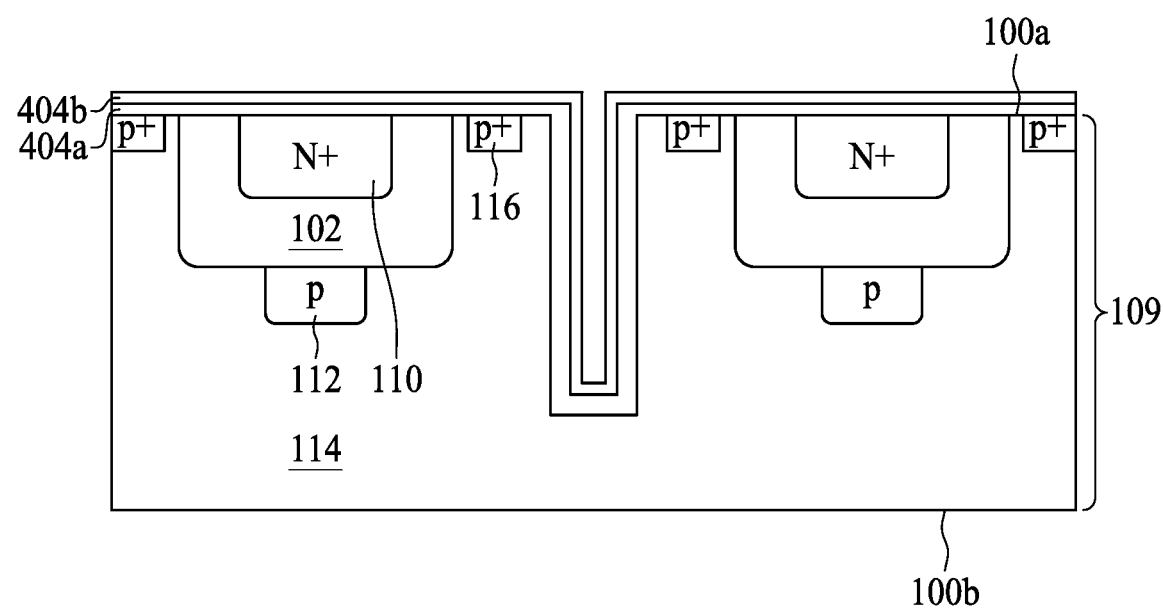
Figure 16:
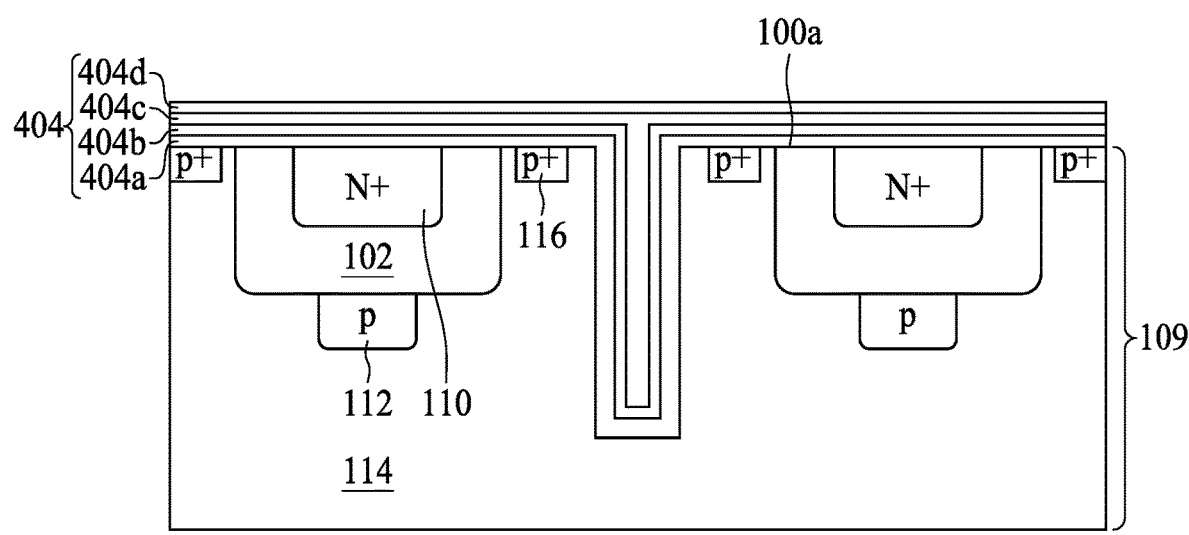

With reference to FIG. 14, a trench 1402 is formed in the substrate 109 between the pixels from the front surface 100a toward the back surface 100b but not passing through the substrate 109. In many instances, the trench 1402 may have a trapezoidal profile as shown in FIG. 14. However, this is not a limitation of the present disclosure. In many instances, the trench 1402 may have an elongated rectangular profile. With reference to FIG. 15, the first SiO$_2$ layer 404a and the first undoped poly layer 404b are deposited by a physical vapor deposition technique (e.g., PVD, CVD, etc.). The first SiO$_2$ layer 404a and the first undoped poly layer 404b may be conformally formed along the front surface 100a of the substrate 109 and extend into the trench 1402 along sidewalls and a bottom of the trench 1402. As shown in FIG. 1, after depositing the first undoped poly layer 404b, the trench 1402 is not yet completely filled up. However, this is not a limitation of the present disclosure. In some embodiments, the trench 1402 may be filled up after depositing the first SiO$_2$ layer 404a and the first undoped poly layer 404b.

Next, the second SiO$_2$ layer 404c is deposited over the first undoped poly layer 404b. The trench 1402 is filled up by the second SiO$_2$ layer 404c, and then the second undoped poly layer 404d is deposited over the second SiO$_2$ layer 404c. A planarization process, for example, chemical mechanical polishing (CMP), may be performed upon the second SiO$_2$ layer 404c before depositing the second undoped poly layer 404d. In some embodiments, the second undoped poly layer 404d may include a triangular region extending into the second SiO$_2$ layer 404c from a bottom of the second undoped poly layer 404d when a top surface of the second SiO$_2$ layer 404c is not completely planarized by the planarization process.

Figure 17:
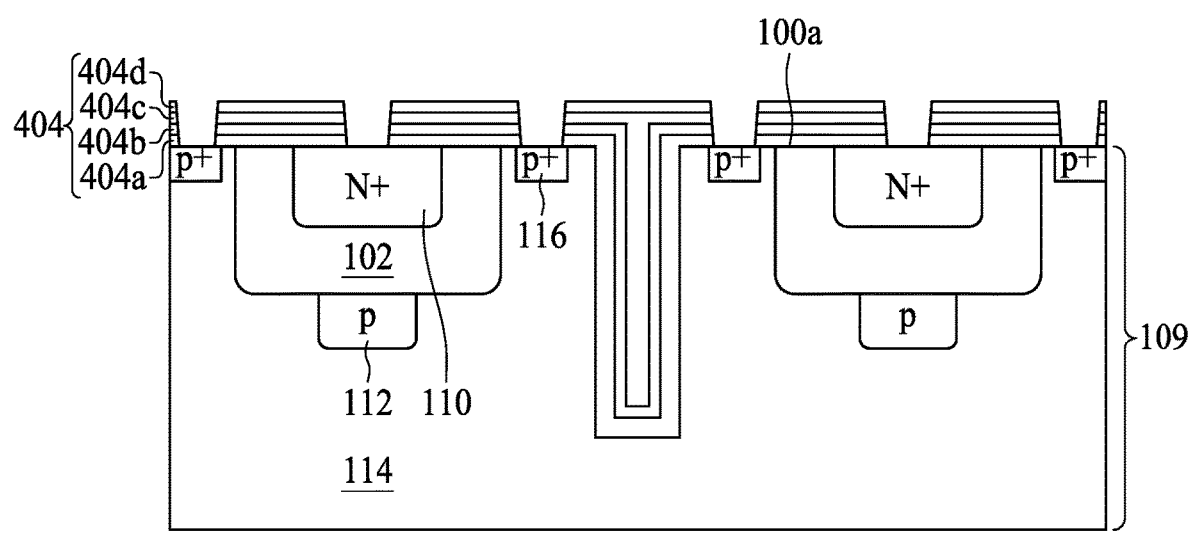
Figure 18:
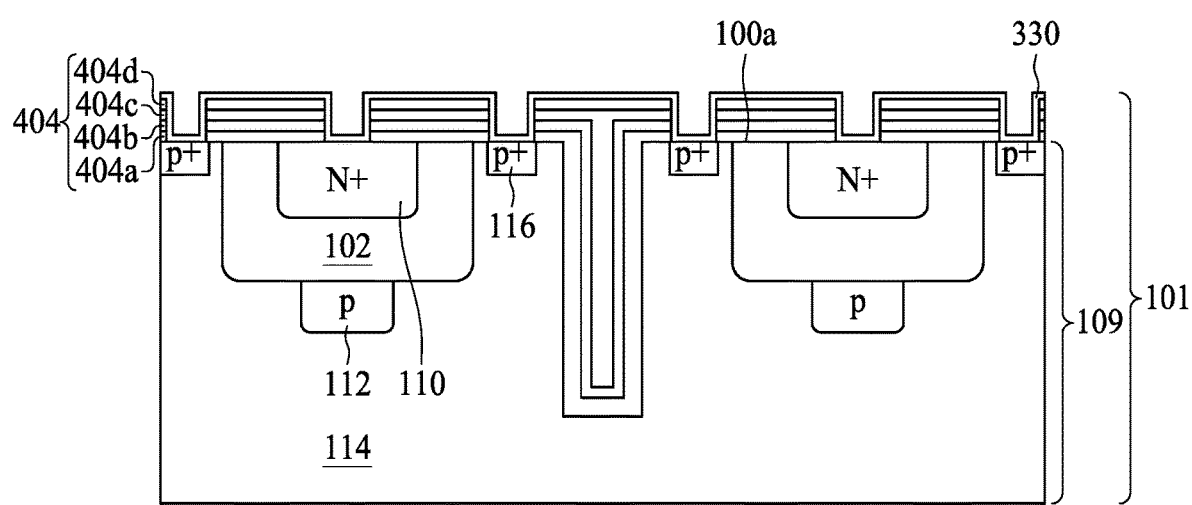
Figure 19:
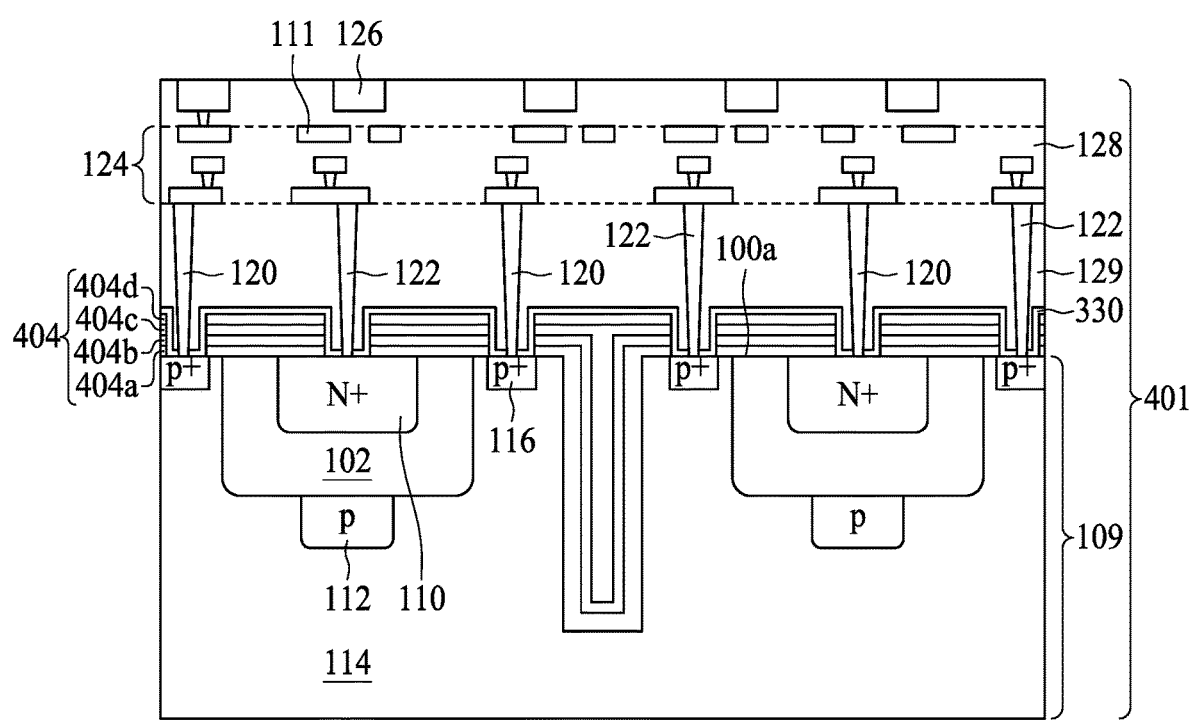
Figure 20:
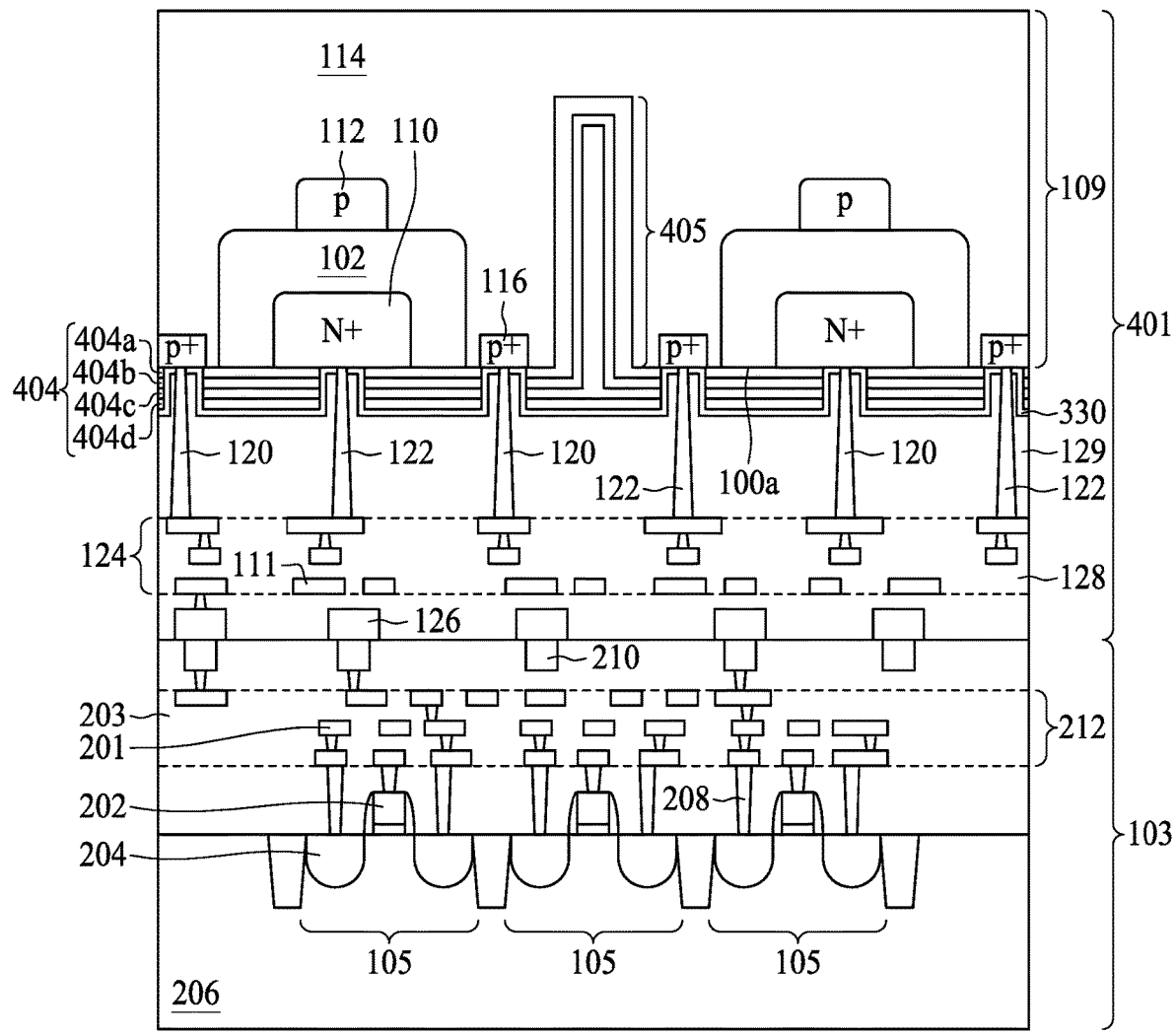

The first SiO$_2$ layer 404a, the first undoped poly layer 404b, the second SiO$_2$ layer 404c and the second undoped poly layer 404d form the DBR 404. The DBR 404 is then etched to from openings in order to expose at least a portion of the common nodes 116 and the sensing nodes 110. The openings through the DBR 404 may have trapezoidal profiles as shown in FIG. 17. However, this is not a limitation of the present disclosure. In many instances, the openings through the DBR 404 may have elongated rectangular profiles. With reference to FIG. 18, the CESL 330 is blanket formed over the resultant structure of DBR 404 and the substrate 109 in a manner substantially the same or similar to that of FIG. 10. The remaining operations may be achieved through a manner substantially the same or similar to that of FIGS. 11 and 12. Thus details are omitted here for conciseness.

Some embodiments of the present disclosure provide an image sensor. The image sensor includes: a common node heavily doped with dopants of a first conductivity type, the common node being within the substrate and abutting the front surface of the substrate; and a sensing node heavily doped with dopants of a second conductivity type opposite to the first conductivity type, the sensing node being within the substrate and abutting the front surface of the substrate; an interconnect structure, wherein the front surface of the substrate faces the interconnect structure; a distributed Bragg reflector (DBR) between the front surface of the substrate and the interconnect structure; a first contact plug passing through the DBR and coupling the common node to the interconnect structure; and a second contact plug passing through the DBR and coupling the sensing node to the interconnect structure.

Some embodiments of the present disclosure provide an image sensor. The image sensor includes: a substrate having a front side and a back side, wherein the substrate includes a first pixel and a second pixel each having: a first common node and a second common node heavily doped with dopants of a first conductivity type, the first and second common nodes being within the substrate and abutting the front side of the substrate; and a sensing node heavily doped with dopants of a second conductivity type opposite to the first conductivity type, the sensing node being within the substrate and abutting the front side of the substrate, and the sensing node being between the first and second common nodes; an interconnect structure, wherein the front side of the substrate faces the interconnect structure; a distributed Bragg reflector (DBR) between the front side of the substrate and the interconnect structure, at least a portion of the DBR extending into the substrate between the first and second pixels; a first contact plug passing through the DBR and coupling the first and second common nodes to the interconnect structure; and a second contact plug passing through the DBR and coupling the sensing node to the interconnect structure.

Some embodiments of the present disclosure provide an image sensor. The image sensor includes: a substrate having a front surface and a back surface; a photodiode (PD) within the substrate and abutting the front surface of the substrate; a floating diffusion regions (FD) within the substrate and abutting the front surface of the substrate; a gate at the front surface of the substrate; between the PD and FD; an interconnect structure, wherein the front surface of the substrate faces the interconnect structure; a distributed Bragg reflector (DBR) between the front surface of the substrate and the interconnect structure; a first contact plug passing through the DBR and coupling the gate to the interconnect structure; and a second contact plug passing through the DBR and coupling the FD to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a substrate having a front side and a back side, wherein the substrate includes a first pixel and a second pixel each having:
      a first common node and a second common node heavily doped with dopants of a first conductivity type, the first and second common nodes being within the substrate and abutting the front side of the substrate; and
      a sensing node heavily doped with dopants of a second conductivity type opposite to the first conductivity type, the sensing node being within the substrate and abutting the front side of the substrate, and the sensing node being between the first and second common nodes;
   an interconnect structure, wherein the front side of the substrate faces the interconnect structure;
   a distributed Bragg reflector (DBR) between the front side of the substrate and the interconnect structure, at least a portion of the DBR extending into the substrate between the first and second pixels;
   a first contact plug passing through the DBR and coupling the first and second common nodes to the interconnect structure; and
   a second contact plug passing through the DBR and coupling the sensing node to the interconnect structure.

2. The image sensor of claim 1, wherein the DBR includes alternating insulating layers.

3. The image sensor of claim 2, wherein the DBR includes at least two pairs of layers, and each pair of layers includes a first layer and a second layer selected from two of silicon dioxide ($SiO_2$), undoped polysilicon (poly) and silicon nitride ($Si_3N_4$).

4. The image sensor of claim 3, wherein the first layer includes $SiO_2$, the second layer includes undoped poly, and the first layer is facing the front side of the substrate.

5. The image sensor of claim 3, wherein the DBR includes a first pair and a second pair of $SiO_2$/undoped poly, and the first pair and the $SiO_2$ of the second pair extend into the substrate between the first and second pixels, and the undoped poly of the second pair is free from extending into the substrate.

6. The image sensor of claim 5, wherein the undoped poly of the first pair forms a U-shape structure in the substrate.

7. The image sensor of claim 1, wherein the DBR is distanced from the first contact plug and the second contact plug by a distance greater than 0.

8. The image sensor of claim 1, wherein the DBR is distanced from the second contact plug by a distance greater than 0, and the DBR is in physical contact with the first contact plug.

9. An image sensor, comprising:
   a substrate having a front surface and a back surface, wherein the substrate includes:
      a common node heavily doped with dopants of a first conductivity type, the common node being within the substrate; and
      a sensing node heavily doped with dopants of a second conductivity type opposite to the first conductivity type, the sensing node being within the substrate;
   an interconnect structure, wherein the front surface of the substrate faces the interconnect structure;
   a distributed Bragg reflector (DBR) between the front surface of the substrate and the interconnect structure;
   a first contact plug passing through the DBR and coupling the common node to the interconnect structure; and
   a second contact plug passing through the DBR and coupling the sensing node to the interconnect structure.

10. The image sensor of claim 9, wherein at least a portion of the DBR extending into the substrate.

11. The image sensor of claim 10, wherein the DBR includes alternating insulating layers.

12. The image sensor of claim 11, wherein the DBR includes at least two pairs of layers, and each pair of layers includes a first layer and a second layer selected from two of silicon dioxide ($SiO_2$), undoped polysilicon (poly) and silicon nitride ($Si_3N_4$).

13. The image sensor of claim 12, wherein the first layer includes $SiO_2$, the second layer includes undoped poly, and the first layer is facing the front side of the substrate.

14. The image sensor of claim 12, wherein the DBR includes a first pair and a second pair of $SiO_2$/undoped poly, and the first pair and the $SiO_2$ of the second pair extend into the substrate, and the undoped poly of the second pair is free from extending into the substrate.

15. An image sensor, comprising:
   a substrate having a front surface and a back surface, wherein the substrate includes:
      a common node heavily doped with dopants of a first conductivity type, the common node being within the substrate; and
      a sensing node heavily doped with dopants of a second conductivity type opposite to the first conductivity type, the sensing node being within the substrate;
   an interconnect structure, wherein the front surface of the substrate faces the interconnect structure;
   a lens at the back surface of the substrate, wherein a center of the lens overlaps a center of the sensing node from a top view; and
   a distributed Bragg reflector (DBR) between the front surface of the substrate and the interconnect structure, at least a portion of the DBR extending into the substrate.

16. The image sensor of claim 15, wherein the DBR includes alternating insulating layers.

17. The image sensor of claim 16, wherein the DBR includes at least two pairs of layers, and each pair of layers includes a first layer and a second layer selected from two of silicon dioxide ($SiO_2$), undoped polysilicon (poly) and silicon nitride ($Si_3N_4$).

18. The image sensor of claim 17, wherein the first layer includes $SiO_2$, the second layer includes undoped poly, and the first layer is facing the front side of the substrate.

19. The image sensor of claim 17, wherein the DBR includes a first pair and a second pair of $SiO_2$/undoped poly, and the first pair and the $SiO_2$ of the second pair extend into the substrate, and the undoped poly of the second pair is free from extending into the substrate.

20. The image sensor of claim 19, wherein the undoped poly of the first pair forms a U-shape structure in the substrate.

* * * * *